United States Patent [19]

Miwada

[11] Patent Number: 5,309,240
[45] Date of Patent: May 3, 1994

[54] CCD LINEAR IMAGE SENSOR INCLUDING A CCD SHIFT REGISTER ON BOTH SIDES OF LINEARLY ARRANGED PHOTOSENSOR CELLS

[75] Inventor: Kazuo Miwada, Tokyo, Japan

[73] Assignee: NEC Corporation, Tokyo, Japan

[21] Appl. No.: 822,759

[22] Filed: Jan. 21, 1992

[30] Foreign Application Priority Data

Jan. 18, 1991 [JP] Japan .................. 3-004190

[51] Int. Cl.$^5$ ..................... H04N 3/14; H04N 5/335
[52] U.S. Cl. ..................... 348/311; 257/241; 348/321
[58] Field of Search ............. 358/213.29, 213.31, 358/213.23, 213.11; 257/241, 233; H04N 5/335

[56] References Cited

U.S. PATENT DOCUMENTS

| | | | |
|---|---|---|---|
| 4,210,825 | 7/1980 | Crochiere et al. | 257/241 |
| 4,251,834 | 2/1981 | Hall . | |
| 4,438,457 | 3/1984 | Tandon et al. | 358/213.29 |
| 4,628,347 | 12/1986 | Sato et al. | 357/242 R |
| 4,649,554 | 3/1987 | Boudewijns et al. | 257/241 |
| 4,675,549 | 6/1987 | Steffe et al. | 358/213.23 |
| 4,712,137 | 12/1987 | Kadekodi et al. . | |
| 4,811,068 | 3/1989 | Kinoshita . | |
| 5,025,318 | 6/1991 | Nagura | 358/213.29 |
| 5,043,819 | 8/1991 | Cheon et al. | 358/213.23 |
| 5,225,695 | 7/1993 | Naka et al. | 257/241 |

FOREIGN PATENT DOCUMENTS

| | | |
|---|---|---|
| 0282150 | 9/1988 | European Pat. Off. . |
| 0333260 | 9/1989 | European Pat. Off. . |
| 0383519 | 8/1990 | European Pat. Off. . |
| 58-1381 | 1/1983 | Japan .................. 358/213.23 |
| 59-099764 | 6/1984 | Japan . |
| 3089863 | 4/1989 | Japan .................. H04N 5/335 |
| 1-255273 | 10/1989 | Japan .................. 358/213.23 |
| 3-159382 | 7/1991 | Japan .................. H04N 5/335 |

Primary Examiner—Michael T. Razavi
Assistant Examiner—Wendy R. Greening
Attorney, Agent, or Firm—Sughrue, Mion, Zinn, Macpeak & Seas

[57] ABSTRACT

A CCD linear image sensor comprises an array of linearly arranged photosensor cells, and a pair of CCD shift registers respectively arranged on both sides of the array of linearly arranged photosensor cells. The CCD shift registers are coupled in parallel to the linearly arranged photosensor cell array so as to read out signal charges from predetermined photosensor cells of the linearly arranged photosensor cell array and to transfer the read-out signal charge serially in the CCD shifter register. An output end of each CCD shift register is branched into a pair of CCD shift register transfer paths. An output circuit is connected to an output terminal of each of the branched CCD shift register transfer paths.

4 Claims, 5 Drawing Sheets

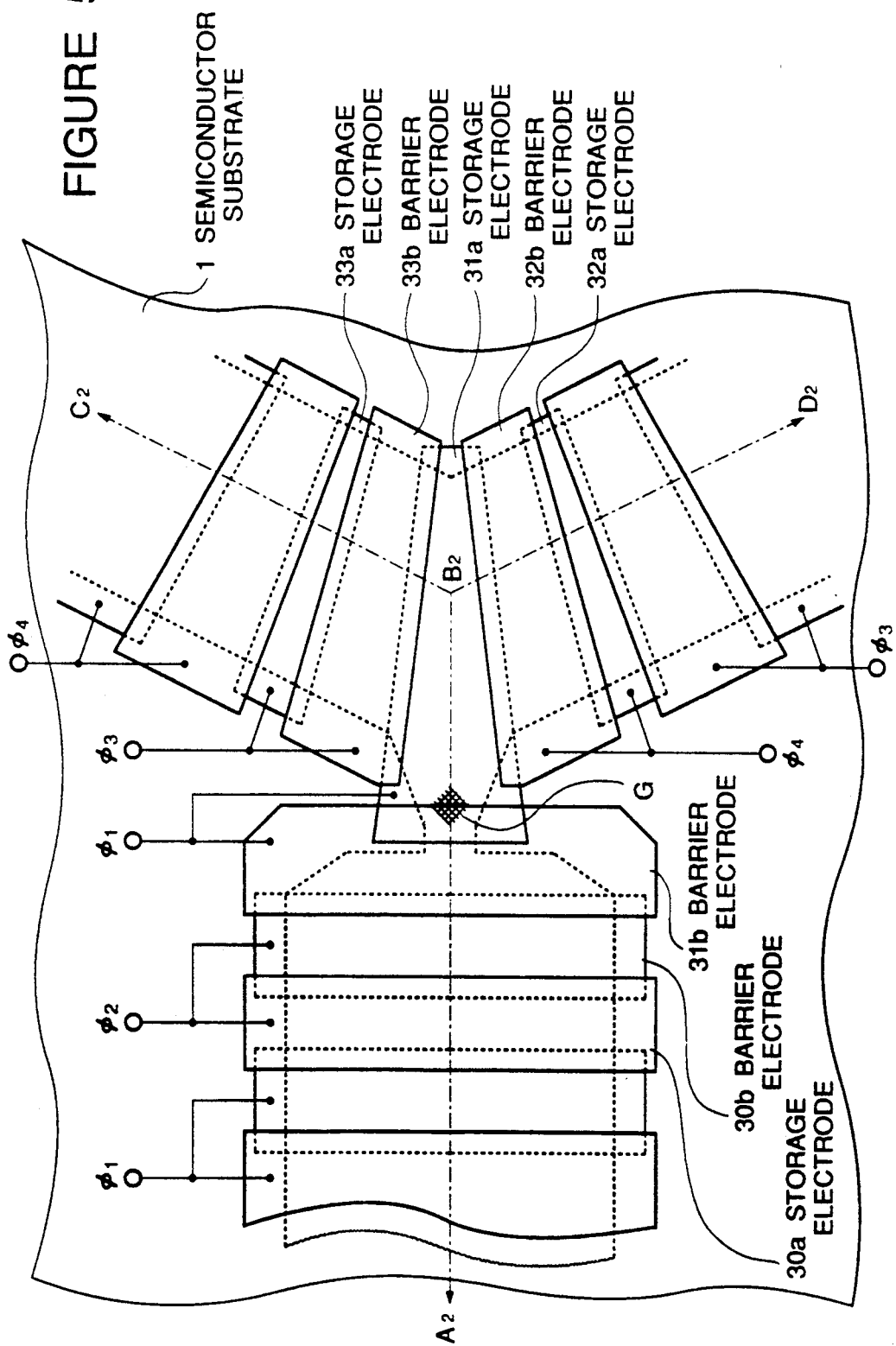

CCD LINEAR IMAGE SENSOR INCLUDING A CCD SHIFT REGISTER ON BOTH SIDES OF LINEARLY ARRANGED PHOTOSENSOR CELLS

BACKGROUND OF THE INVENTION

1. Field of the Invention

The present invention relates to a CCD image sensor including CCD shift registers, and more specifically to a structure for outputting at a high speed a transferred charge from a pair of CCD shift registers arranged on both sides of an array of linearly arranged photosensor cells, respectively.

2. Description of Related Art

CCD shift registers are now widely used in a image sensor, a delayed lines, etc. In particular, the image sensor has been contrived to assume a so called two-line type in which a CCD shift register to be arranged along one array of linearly arranged photosensors are divided into a pair of CCD shift registers arranged in parallel to and at both sides of the linearly arranged photosensor array, in order to elevate the operation speed (for example, U.S. Pat. No. 4,712,137).

One typical two-line type of image sensor of the prior art includes first and second arrays of linearly arranged photosensor cells formed in a semiconductor substrate of one conduction type and shielded from each other by a photo shield located between the two arrays of linearly arranged photosensor cells. At an outside of the first array of linearly arranged photosensor cells, a first transfer gate array is provided in parallel to the first array of linearly arranged photosensor cells. At an outside of the first transfer gate array, first and second CCD shift registers are arranged in parallel to each other and to the first transfer gate array, so that odd-numbered cells of the first linearly arranged photosensor array are read out through the first transfer gate array to the first CCD shift registers and even-numbered cells of the first linearly arranged photosensor array are read out through the first transfer gate array to the second CCD shift registers. Each of the first and second CCD shift registers has a serial output connected to an output buffer, so that an output of the two output buffers will be combined at an external. With this arrangement, signal charges stored in the first linearly arranged photosensor array can be read out at a high speed, since the signal charges stored in the first linearly arranged photosensor array are alternately distributed into the two CCD shift registers and then transferred through the two CCD shift registers. Accordingly, the read-out speed become a double of that obtained when only one CCD shift register is provided to one linearly arranged photosensor array.

Similarly, at an outside of the second array of linearly arranged photosensor cells, a second transfer gate array is provided in parallel to the second array of linearly arranged photosensor cells. At an outside of the second transfer gate array, third and fourth CCD shift registers are arranged in parallel to each other and to the second transfer gate array, so that odd-numbered cells of the second linearly arranged photosensor array are read out through the second transfer gate array to the third CCD shift registers and even-numbered cells of the second linearly arranged photosensor array are read out through the second transfer gate array to the fourth CCD shift registers. Each of the third and fourth CCD shift registers has an serial output connected to an output buffer.

In the above mentioned arrangement, the first linearly arranged photosensor array and the second linearly arranged photosensor array are staggered by a half bit or a half of photosensor cell. Therefore, if the two linearly arranged photosensor arrays are read out in the order of a first cell of the first linearly arranged photosensor array, a first cell of the second linearly arranged photosensor array, a second cell of the first linearly arranged photosensor array, a second cell of the second linearly arranged photosensor array, . . . , and if the outputs of the two linearly arranged photosensor arrays are combined to one output, a considerably high degree of resolution of image can be read out at a high speed.

In the above mentioned high-speed high-resolution image sensor, in order to transfer the signal charge to an outside CCD shift register of the first and second CCD shift registers and an outside shift register of the third and fourth CCD shift registers, the signal charges must be passed through an inside CCD shift register of each pair of CCD shift registers. When the signal charges are passed through the inside CCD shift register, a portion of the signal charges remains in the inside CCD shift register, and therefore, the transfer efficiency lowers. In addition, the remaining signal charge is mixed into the signal charge to be transferred in the inside CCD shift register.

SUMMARY OF THE INVENTION

Accordingly, it is an object of the present invention to provide a CCD linear image sensor which has overcome the above mentioned defect of the conventional one.

Another object of the present invention is to provide a CCD linear image sensor which does not have a problem in which a portion of a signal charge to be serially transferred through a first CCD shift register remains in a second CCD shift register, and the signal charge remaining in the second CCD shift register is mixed into the signal charge to be transferred in the second CCD shift register.

The above and other objects of the present invention are achieved in accordance with the present invention by a CCD linear image sensor comprising an array of linearly arranged photosensor cells, a pair of CCD shift registers arranged at both sides of the array of linearly arranged photosensor cells, each of the pair of CCD shift registers being coupled in parallel to the array of linearly arranged photosensor cell so as to read out signal charges from predetermined photosensor cells of the array of linearly arranged photosensor cells and to transfer the read-out signal charge serially in the CCD shifter register, branch means coupled to an output end of each of the pair of CCD shift registers so as to branch the output end of each CCD shift register into a pair of transfer paths, and an output circuit connected to an output terminal of each of the branched transfer paths of each of the pair of CCD shift registers.

In a preferred embodiment, each of the transfer paths is formed of a CCD shift register, and the branch means is constituted of a final transfer electrode of each CCD shift register. The final transfer electrode has a shape having a channel direction length increasing from each side edge portion to a center where the transfer path is branched into the two transfer path. With this arrangement, an electric field due to a narrow channel effect is generated toward the charge transfer direction.

The above and other objects, features and advantages of the present invention will be apparent from the following description of preferred embodiments of the invention with reference to the accompanying drawings.

BRIEF DESCRIPTION OF THE DRAWINGS

FIG. 5 is a detailed plan view of a transfer path branch section of another embodiment of the CCD image sensor in accordance with the present invention.

DESCRIPTION OF THE PREFERRED EMBODIMENTS

Figure 1:
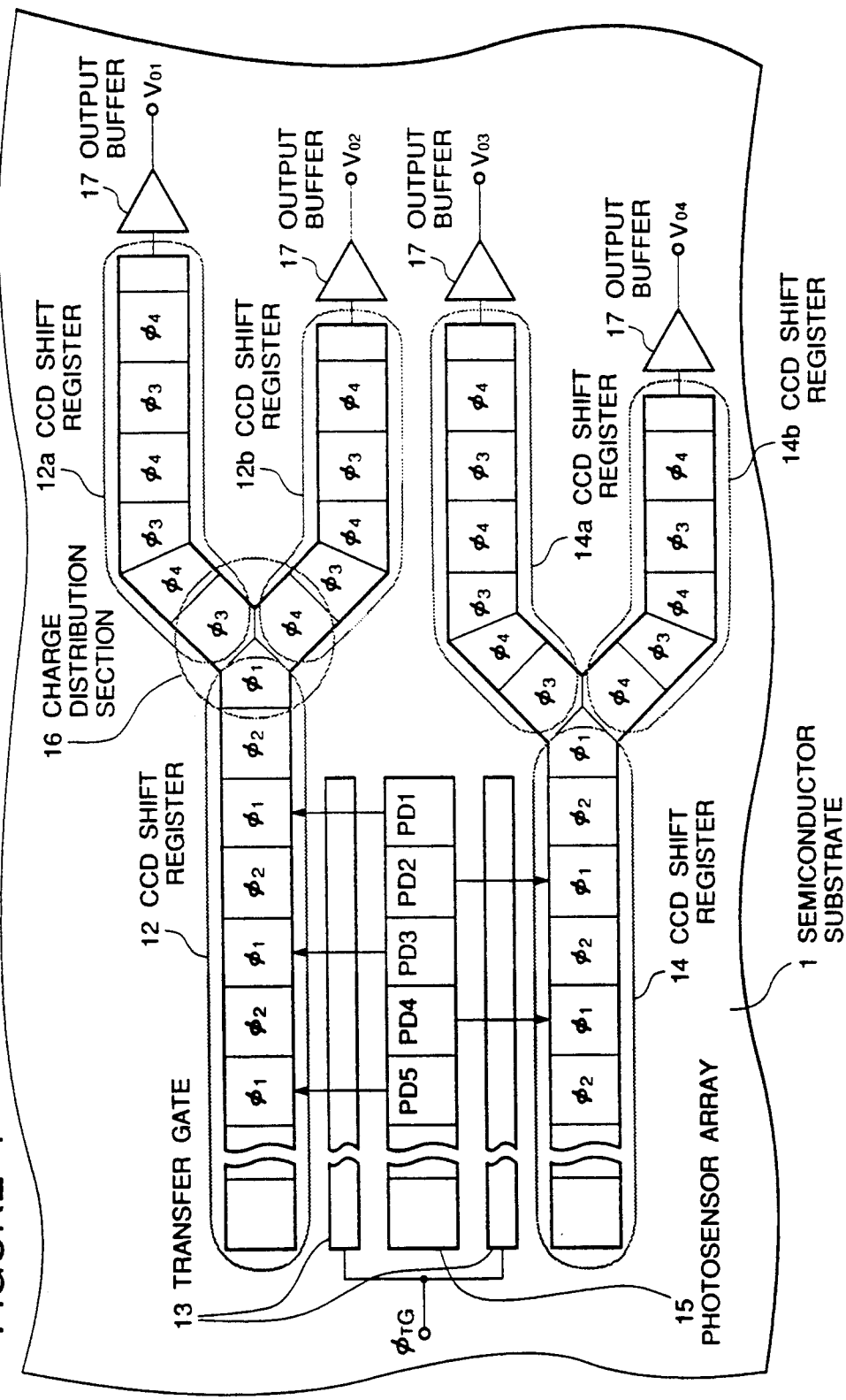
FIG. 1 is a partially broken, diagrammatic plan view of one embodiment of the CCD image sensor in accordance with the present invention.

Referring to FIG. 1, there is shown a partially broken, diagrammatic plan view of one embodiment of the CCD image sensor in accordance with the present invention. The shown CCD image sensor includes an array 15 of photosensor cells (PD1, PD2, PD3, PD4, PD5, ...) formed in a semiconductor substrate of one conduction type. A pair of transfer gates 13 are formed at both sides of the photosensor cell array 15 and coupled in parallel to odd-numbered cells (PD1, PD3, PD5, ...) and even-numbered cells (PD2, PD4, ...) of the photosensor cell array 15, respectively. The pair of transfer gates 13 are driven with a transfer clock $\Phi_{TG}$. A pair of CCD shift registers 12 and 14 are formed at an outside of each of the transfer gates 13 and coupled in parallel to the corresponding transfer gate, so that signal charges accumulated in the odd-numbered cells (PD1, PD3, PD5, ...) of the photosensor cell array 15 are in parallel transferred to the CCD shift register 12 under control of the transfer gate 13, and that signal charges accumulated in the even-numbered cells (PD2, PD4, ...) of the photosensor cell array 15 are in parallel transferred to the CCD shift register 14 under control of the transfer gate 13. The CCD shift registers 12 and 14 are driven with two-phase clocks $\Phi_1$ and $\Phi_2$ so as to serially transfer the received signal charges.

The CCD shift register 12 is branched at its output end portion into two CCD shifter registers 12a and 12b. Similarly, the CCD shift register 14 is branched at its output end portion into two CCD shifter registers 14a and 14b. These branched CCD shift registers 12a, 12b, 14a and 14b are with two-phase clocks $\Phi_3$ and $\Phi_4$ so as to serially transfer the received signal charges. Output terminals of the branched CCD shift registers 12a, 12b, 14a and 14b are connected to four output buffers 17, respectively, which in turn have their output terminal connected to output terminals $V_{O1}$, $V_{O2}$, $V_{O3}$ and $V_{O4}$, respectively.

With this arrangement, a signal charge of each photosensor cell can be transferred to the corresponding CCD shift register through only one transfer stage. Therefore, the problem of the prior art in which a not-transferred signal charge remains in another CCD shifter register. On the other hand, since four output terminals are provided, it is possible to read the signal charges at a high speed.

Figure 2:
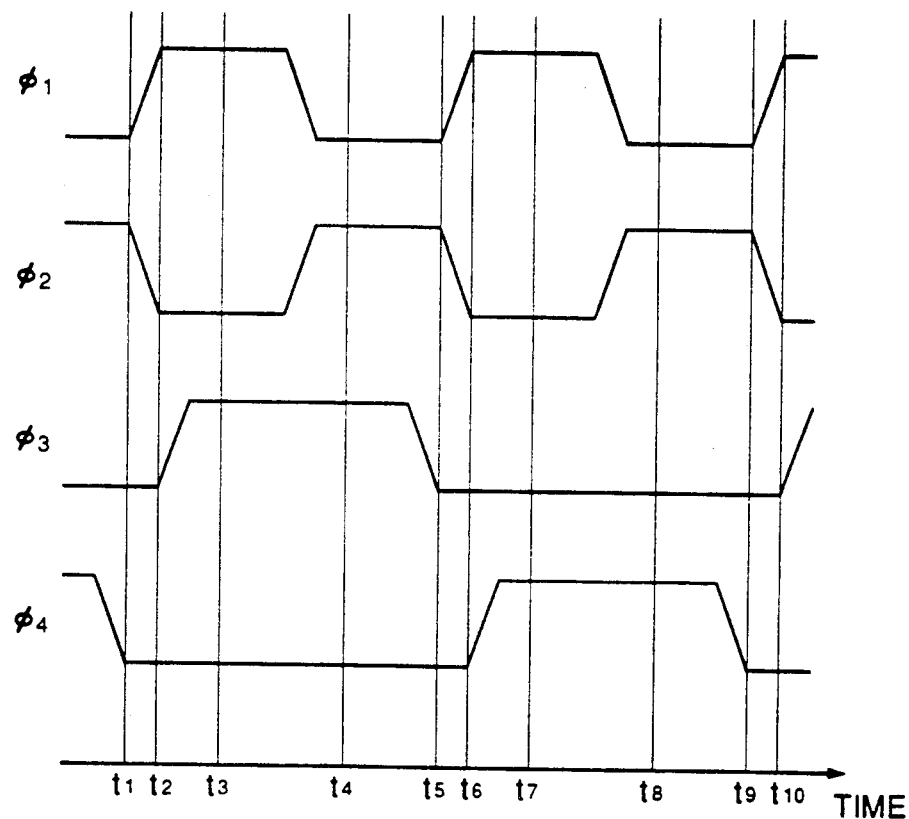
FIG. 2 is a timing chart of clocks used for driving the CCD image sensor shown in FIG. 1.
Figure 3:
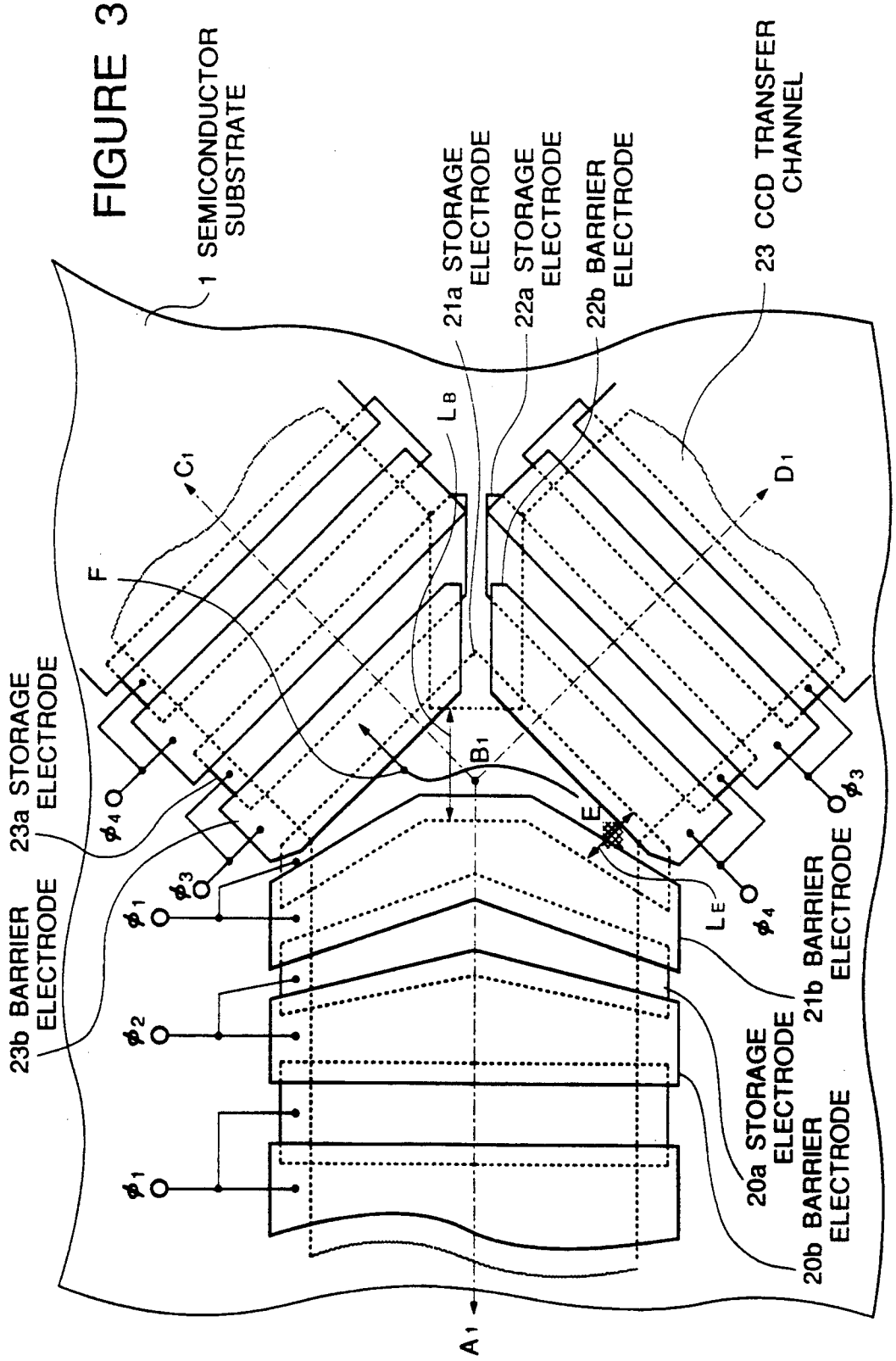
FIG. 3 is a detailed plan view of a transfer path branch section of the CCD image sensor shown in FIG. 1.

Referring to FIG. 3, there is shown a detailed plan view of a transfer path branch section in which one CCD shift register is branched into two CCD shift registers. Also referring to FIGS. 4A and 4B, there are shown potential diagrams along the lines A1-B1-C1 and A1-B1-D1 in FIG. 3. In addition, FIG. 2 shows a timing chart of the transfer clocks $\Phi_1$, $\Phi_2$, $\Phi_3$, and $\Phi_4$ used for driving the CCD image sensor shown in FIG. 1.

As shown in FIG. 3, each transfer electrode of the two-phase driven CCD shift register is composed of one storage electrode 20a, 21a, 22a, 23a, ... and one barrier electrode 20b, 21b, 22b, 23b, .... The substrate 1 includes a CCD transfer channel 23 formed in a surface of the substrate under the transfer electrodes applied with the clocks $\Phi_1$, $\Phi_2$, $\Phi_3$, and $\Phi_4$. This CCD transfer channel 23 is formed of an impurity layer of the conduction type opposite to that of the substrate 1. The CCD transfer channel 23 has another impurity regions 24 of the same conduction type as that of the substrate 1. The impurity regions 24 are formed under a portion of the barrier electrode which does not overlap the storage electrode. Thus, a buried channel type two-phase driven CCD shift register is constituted. Here, for simplification of description, assume that the substrate 1 and the impurity regions 24 are of a P-type, and the impurity layer 23 is of an N-type.

Figure 4A:
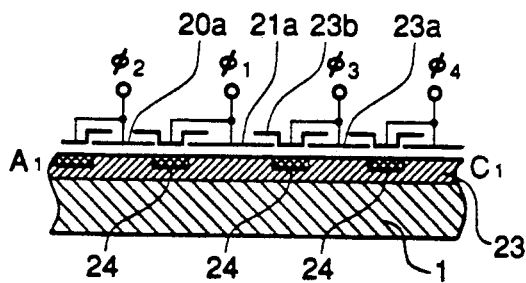
FIGS. 4A and 4B are potential diagrams of two sections in FIG. 3.
Figure 4A:
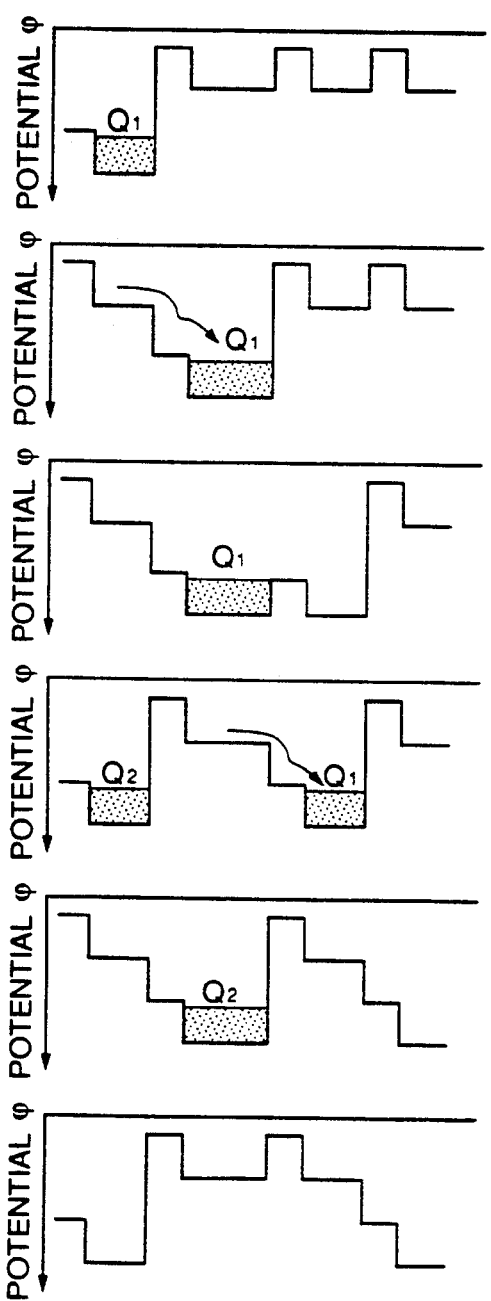
Figure 4B:
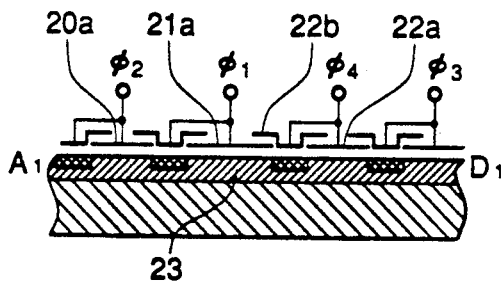
Figure 4B:
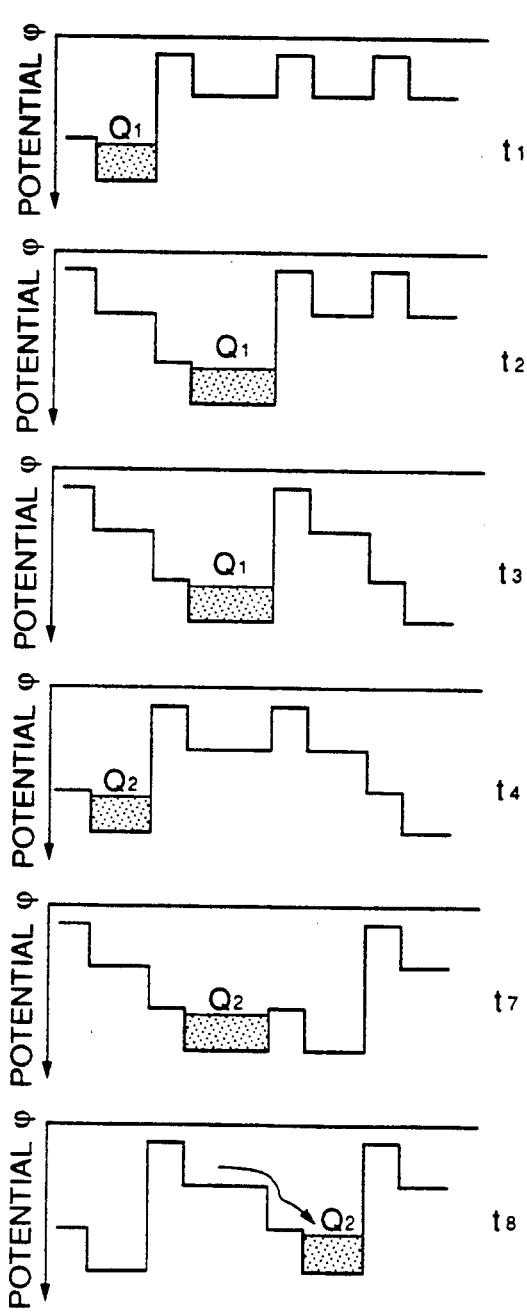

As shown in the timing chart of FIG. 2, only the clock $\Phi_2$ is at a high level at the time $t_1$. Therefore, as shown in FIG. 4, a signal charge $Q_1$ exists under the storage electrode 20a applied with the clock $\Phi_2$. At the time $t_2$, since only the clock $\Phi_1$ is brought to the high level and the clock $\Phi_2$ is brought to a low level, the signal charge $Q_1$ is caused to move under the storage electrode 21a applied with the clock $\Phi_1$. At the time $t_3$, the clock $\Phi_3$ is brought to a high level, but the signal charge $Q_1$ under the storage electrode 21a is maintained as it is. At the time $t_4$, the clock $\Phi_1$ is brought to a low level and the clock $\Phi_3$ is maintained at a high level, so that the signal charge $Q_1$ is caused to move under the storage electrode 23a applied with the clock $\Phi_3$. Here, attention should be paid to an inlet of the CCD shift register 12b located adjacent to the storage electrode 21a. Since the clock $\phi_4$ applied to the barrier electrode 22b is at a low level, the barrier electrode 22b functions as a barrier as shown in FIG. 4B. Therefore, the signal charge $Q_1$ does not flow into the storage electrode 22a, and flows into only the storage electrode 23a.

A signal charge $Q_2$ transferred in the CCD shift register 12 next to the signal charge $Q_1$ is caused to move under the storage electrode 21a at the time $t_7$. At the time $t_7$, the clock $\phi_3$ is at a low level contrary to the time $t_4$, and therefore, the barrier electrode 23b functions as a barrier as shown in FIG. 4A. On the other hand, since the clock $\Phi_4$ is at a high level, the barrier electrode 22b functions as a transfer electrode so that the signal charge $Q_2$ is caused to move under the storage electrode 22a.

As mentioned above, the signal charges transferred in the CCD shift register 12 are alternately transferred to the CCD shift registers 12a and 12b by applying the clocks as shown in FIG. 2. Similarly to the CCD shift register as mentioned above, signal charges transferred in the CCD shift register 14 are alternately transferred to the CCD shift registers 14a and 14b.

As mentioned above, the signal charge transferred in one CCD shift register can be distributed into two CCD shift registers. Here, a shape of the storage electrode 21a shown in FIG. 3 for distributing the signal charge into the two CCD shift registers is important.

Now, the shape of the storage electrode 21a will be described.

In the potential diagram of FIG. 4, when the signal charge flows from under the storage electrode 21a to under the storage electrode 23a at the time t4, a signal charge existing at a location "E" in FIG. 3 must move a long distance as shown by an arrow F. For this reason, a time necessary for this movement becomes long. Specifically discussing this problem by assuming that the CCD shift register has a channel width of 30 μm and the required movement distance is about 30 μm, the time constant $\tau$ of the movement of the signal charge due to heat diffusion is as follows:

$$\tau = \frac{4L^2}{\pi^2 D} \simeq 540 \text{ (n sec)} \quad (1)$$

where L is the movement distance; D is diffusion coefficient of electric charge and D=6.75 cm$^2$/cm in the case of electrons.

The above equation is shown in page 73 of "Fundamental and Application of Charge Transfer Devices CCD, BBD" published form Kindai Kagaku-sha of Japan. With no modification, a maximum driving frequency of the disclosed charge transfer device is limited in this charge distribution section 16.

In order to overcome this problem, the storage electrode 21a of this embodiment is shaped to approximate a triangle so that a channel direction length $L_E$ of the location "E" of the storage electrode 21a is shorter than a channel direction length $L_B$ of a portion of the storage electrode 21a near to a center line A1-B1 of the CCD shift register. With this difference in the channel direction length of the storage electrode 21a, a potential difference is created by a so called narrow channel effect.

Specifically discussing by assuming $L_E = 3$ μm and $L_B = 6$ μm, the potential difference of about 1 V is introduced between the location "E" and the location having the channel direction length $L_B$. By this potential difference, an electric field is generated from the location "E" toward the barrier electrode 23b. A time $\tau_E$ of the electric charge due to this electric field becomes as follows, assuming that the mobility μ of electron is 1000 cm$^2$/V-sec, the movement distance L is 30 μm and the potential difference $\Delta\Phi_V$ is 1 V.

$$\tau_E = \frac{L}{\mu \cdot \frac{\phi v}{L}} \simeq 9 \text{ (n sec)} \quad (2)$$

Namely, the time $\tau_E$ is remarkably smaller than the constant $\tau$ of movement due to only heat diffusion. Thus, by causing the storage electrode 21a to have the shape having a channel direction length increasing from opposite side edges of the channel toward a center portion of the channel, the drop of the transfer speed in the signal charge distribution section 16 can be prevented.

Referring to FIG. 5, there is shown the signal charge distribution section of another embodiment of the CCD linear image sensor in accordance with the present invention.

The shape of a storage electrode 31a for distributing a signal charge transferred in a CCD shift register composed of storage electrodes 30a and barrier electrodes 30b, into a CCD shift register composed of storage electrodes 33a and barrier electrodes 33b and a CCD shift register composed of storage electrodes 32a and barrier electrodes 32b, is further advanced in comparison with the embodiment shown in FIG. 3. In order to increase the speed of the charge transfer to the storage electrodes 33a and 32a, the channel direction length of the storage electrode 31a is further shortened in comparison with the embodiment shown in FIG. 3. In addition, the channel width of a portion of the storage electrode 31a adjacent to the barrier electrodes 33b and 32b is widened so that the signal charge can be smoothly moved.

An electric charge existing at a location "G" in FIG. 5 is relatively far apart from the barrier electrode 33b. A channel width under a portion around the location "G" is shorter than the other portion of the channel, so that an electric field is generated from the location "G" toward a center of the storage electrode 31b in order to increase the transfer speed.

The invention has thus been shown and described with reference to the specific embodiments. However, it should be noted that the present invention is in no way limited to the details of the illustrated structures but changes and modifications may be made within the scope of the appended claims.

What is claimed is:

1. A CCD linear image sensor comprising: an array of linearly arranged photosensor cells having a first side and a second side;

a first CCD shift register adjacent said first side of said array of linearly arranged photosensor cells;

a second CCD shift register adjacent said second side of said array of linearly arranged photosensor cells;

said first and second CCD shift registers coupled in parallel to said array of linearly arranged photosensor cells so as to read out signal charges from predetermined photosensor cells of said array of linearly arranged photosensor cells and to transfer the read-out signal charge serially in each of said first and second CCD shift registers;

first branch means coupled to an output end of said first CCD shift register so as to branch said output end of said first CCD shift register into a first pair of branched transfer paths;

second branch means coupled to an output end of said second CCD shift register so as to branch said output end of said second CCD shift register into a second pair of branched transfer paths;

an output circuit connected to each output terminal of each of said first and second branched transfer paths;

wherein said first branch means has a first final transfer electrode located just before said first CCD shift register is branched into the first pair of branched transfer paths, wherein said second branch means has a second final transfer electrode located just before said second CCD shift register is branched into the second pair of branched transfer paths, wherein said first final transfer electrode is shaped to approximate a triangle and to have a channel length dimension increasing from a lateral side of the first CCD shift register toward a center-line of the first CCD shift register, and wherein said second final transfer electrode is shaped to approximate a triangle and to have a channel length dimension increasing from a lateral side of the second CCD shift register toward a center-line of the second CCD shift register.

2. A CCD linear image sensor comprising: an array of linearly arranged photosensor cells having a first side and a second side;
   a first CCD shift register adjacent said first side of said array of linearly arranged photosensor cells;
   a second CCD shift register adjacent said second side of said array of linearly arranged photosensor cells;
   said first and second CCD shift registers coupled in parallel to said array of linearly arranged photosensor cells so as to read out signal charges from predetermined photosensor cells of said array of linearly arranged photosensor cells and to transfer the read-out signal charge serially in each of said first and second CCD shift registers;
   first branch means coupled to an output end of said first CCD shift register so as to branch said output end of said first CCD shift register into a first pair of branched transfer paths;
   second branch means coupled to an output end of said second CCD shift register so as to branch said output end of said second CCD shift register into a second pair of branched transfer paths;
   an output circuit connected to an output terminal of each of said first and second branched transfer paths;
   wherein said first branch means has a first final transfer electrode located just before said first CCD shift register is branched into the first pair of branched transfer paths at a first terminating end of said first CCD register, and
   said second branch means has a second final transfer electrode located just before said second CCD shift register is branched into the second pair of branched transfer paths at a second terminating end of said second CCD register,
   wherein a first channel under a portion of said first final transfer electrode adjacent to said terminating end of said first CCD shift register has a width narrower than that of a channel under other portions of said first final transfer electrode, and
   wherein a second channel under a portion of said second final transfer electrode adjacent to said terminating end of said second CCD shift register has a width narrower than that of a channel under other portions of said second final transfer electrode.

3. A CCD linear image sensor claimed in claim 2 wherein
   said first branch means operate to guide each of odd-numbered signal charges transferred in said first CCD shift register to one of said first pair of branched transfer paths and to guide each of even-numbered signal charges transferred in said first CCD shift register to the other of said first pair of branched transfer paths, and
   wherein said second branch means operate to guide each of odd-numbered signal charges transferred in said second CCD shift register to one of said second pair of branched transfer paths and to guide each of even-numbered signal charges transferred in said second CCD shift register to an other of said second pair of branched transfer paths.

4. A CCD linear image sensor claimed in claim 3 wherein said first CCD shift register is coupled to said array of linearly arranged photosensor cells so as to receive a signal charge from each of odd-numbered photosensor cells of said array of linearly arranged photosensor cells and said second CCD shift register is coupled to said array of linearly arranged photosensor cells so as to receive a signal charge from each of even-numbered photosensor cells of said array of linearly arranged photosensor cells.

* * * * *